United States Patent
Tan

(10) Patent No.: US 11,221,946 B2
(45) Date of Patent: Jan. 11, 2022

(54) DATA ARRANGEMENT METHOD, MEMORY STORAGE DEVICE AND MEMORY CONTROL CIRCUIT UNIT

(71) Applicant: PHISON ELECTRONICS CORP., Miaoli (TW)

(72) Inventor: Kok-Yong Tan, Miaoli County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 17 days.

(21) Appl. No.: 16/835,268

(22) Filed: Mar. 30, 2020

(65) Prior Publication Data
US 2021/0255950 A1   Aug. 19, 2021

(30) Foreign Application Priority Data
Feb. 19, 2020   (TW) ................. 109105302

(51) Int. Cl.
| | | |
|---|---|---|
| G06F 12/02 | (2006.01) | |
| G06F 12/06 | (2006.01) | |
| G06F 3/06 | (2006.01) | |
| G06F 12/0882 | (2016.01) | |
| G06F 11/30 | (2006.01) | |
| G11C 16/14 | (2006.01) | |
| G06F 9/30 | (2018.01) | |

(52) U.S. Cl.
CPC .......... *G06F 12/0246* (2013.01); *G06F 3/061* (2013.01); *G06F 3/064* (2013.01); *G06F 3/0611* (2013.01); *G06F 3/0679* (2013.01); *G06F 9/30032* (2013.01); *G06F 11/3037* (2013.01); *G06F 12/0646* (2013.01); *G06F 12/0882* (2013.01); *G11C 16/14* (2013.01); *G06F 2212/7201* (2013.01)

(58) Field of Classification Search
CPC .. G06F 12/0246; G06F 12/0646; G06F 3/061; G06F 3/0611; G06F 3/064; G06F 3/0679
See application file for complete search history.

(56) References Cited

U.S. PATENT DOCUMENTS

| | | | |
|---|---|---|---|
| 7,409,522 B1 * | 8/2008 | Fair .................. | G06F 3/061 |
| | | | 711/170 |
| 8,819,375 B1 | 8/2014 | Pruett et al. | |
| 2011/0099326 A1 * | 4/2011 | Jung .................. | G06F 3/0613 |
| | | | 711/103 |

(Continued)

FOREIGN PATENT DOCUMENTS

TW            563507         12/2016

*Primary Examiner* — Tracy A Warren
(74) *Attorney, Agent, or Firm* — JCIPRNET

(57) ABSTRACT

A data arrangement method, a memory storage device and a memory control circuit unit are provided. The data arrangement method includes: receiving a command from a host, and the command includes a data range; calculating a data disarranged degree according to a logical estimated value of a plurality of logical block addresses of the data range and a physical estimated value of a plurality of physical erasing units mapped to the plurality of logical block addresses of the data range; and determining whether to perform a data arrangement operation according to the data disarranged degree and a threshold to move data in the plurality of physical erasing units according to the plurality of logical block addresses.

18 Claims, 8 Drawing Sheets

(56) References Cited

U.S. PATENT DOCUMENTS

| | | | |
|---|---|---|---|
| 2012/0303918 A1* | 11/2012 | Reed | G06F 3/0644 |
| | | | 711/165 |
| 2015/0095292 A1* | 4/2015 | Dryfoos | G06F 16/1724 |
| | | | 707/693 |
| 2017/0083261 A1* | 3/2017 | Seo | G06F 3/04847 |
| 2017/0220292 A1* | 8/2017 | Hashimoto | G06F 3/0641 |
| 2018/0107593 A1* | 4/2018 | Ogawa | G06F 12/0802 |

* cited by examiner

DATA ARRANGEMENT METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 109105302, filed on Feb. 19, 2020. The entirety of the above-mentioned patent application is hereby incorporated by reference herein and made a part of this specification.

BACKGROUND

Technical Field

The present invention relates to a data arrangement technology for a memory, and in particular to a data arrangement method, a memory storage device and a memory control circuit unit.

Description of Related Art

Digital cameras, mobile phones and MP3 players have been developed rapidly for the past few years, and consumers' needs for storage media have grown significantly as well. Since a rewritable non-volatile memory module (e.g., a flash memory) is characterized in data non-volatility, power saving, minimized size and non-mechanical structure, it is highly suitable to be embedded in various portable media devices listed above.

However, if the written data from the host system is not continuous (e.g., the written data belongs to non-continuous logical sub-units, the logical sub-units belong to one logical unit may be mapped to physical programming units belong to different physical erasing units. In this case, when the host system wants to read the data stored in a plurality of continuous logical sub-units belong to one logical unit, the controller may need to load different logical-physical mapping tables to find out physical programming units in different physical units. After that, the controller needs to send a plurality of read commands to read data from these physical programming units, so that a longer time is needed to perform the read operations, resulting in slower speed for data reading.

SUMMARY

The present invention provides a data arrangement method, a memory storage device and a memory control circuit unit, which can effectively determine whether a data arrangement operation is required.

An exemplary embodiment provides a data arrangement method for a memory storage device including a rewritable non-volatile memory module. The data arrangement method includes: receiving a command having a data range from a host system; calculating a data disarranged degree according to a logical estimated value of a plurality of logical block addresses in the data range and a physical estimated value of a plurality of physical erasing units mapped to the logical block addresses; and determining whether to perform a data arrangement operation to move data in the physical erasing units according to the logical block addresses based on the data disarranged degree and a threshold.

An exemplary embodiment provides a memory storage device which includes a connection interface unit, a rewritable non-volatile memory module, and a memory control circuit unit. The connection interface unit is configured to couple to a host system. The memory control circuit unit is coupled to the connection interface unit and the rewritable non-volatile memory module. The memory control circuit unit is configured to receive a command having a data range from the host system. The memory control circuit unit is further configured to calculate a data disarranged degree according to a logical estimated value of a plurality of logical block addresses in the data range and a physical estimated value of a plurality of physical erasing units mapped to the logical block addresses, and determine whether to perform a data arrangement operation to move data in the physical erasing units according to the logical block addresses based on the data disarranged degree and a threshold.

The present invention provides a memory control circuit unit for controlling a memory storage device including a rewritable non-volatile memory module, and the memory control circuit unit includes a host interface, a memory interface and a memory management circuit. The host interface is configured to couple to a host system. The memory interface is configured to couple to the rewritable non-volatile memory module. The memory management circuit is coupled to the host interface and the memory interface. The memory control circuit unit is configured to receive a command having a data range from the host system. The memory control circuit unit is further configured to calculate a data disarranged degree according to a logical estimated value of a plurality of logical block addresses in the data range and a physical estimated value of a plurality of physical erasing units mapped to the logical block addresses, and determine whether to perform a data arrangement operation to move data in the physical erasing unit according to the logical block addresses based on the data disarranged degree and a threshold.

Based on the above, the data arrangement method, the memory storage device, and the memory control circuit unit provided by the exemplary embodiments may calculate a data disarranged degree according to a logical estimated value of logical block addresses in the data range included in a command and a physical estimated value of physical erasing units mapped to the logical block addresses, and compare the data disarranged degree and the threshold to determine whether the data is centralized or dispersive.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
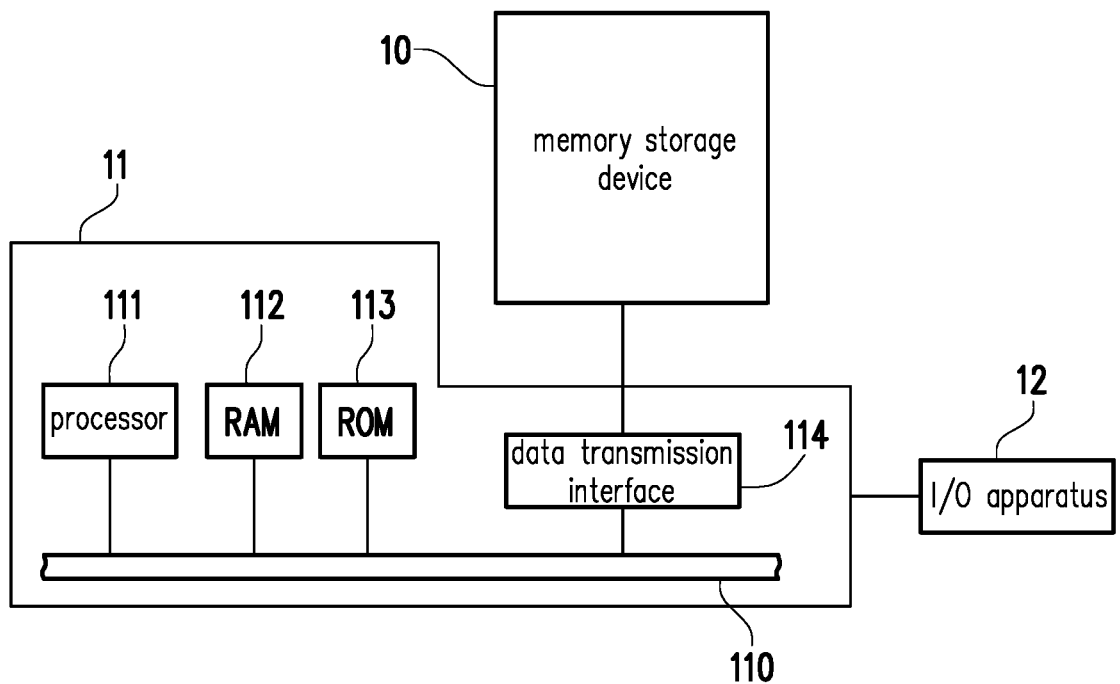
FIG. 1 is a schematic diagram illustrating a host system, a memory storage device, and an input/output (I/O) device according to an exemplary embodiment.

Reference will now be made in detail to the present preferred embodiments of the present disclosure, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In general, a memory storage device (also known as a memory storage system) includes a rewritable non-volatile memory module and a controller (also known as a control circuit unit). The memory storage device is usually configured together with a host system so the host system can write data into the memory storage device or read data from the memory storage device.

Figure 2:
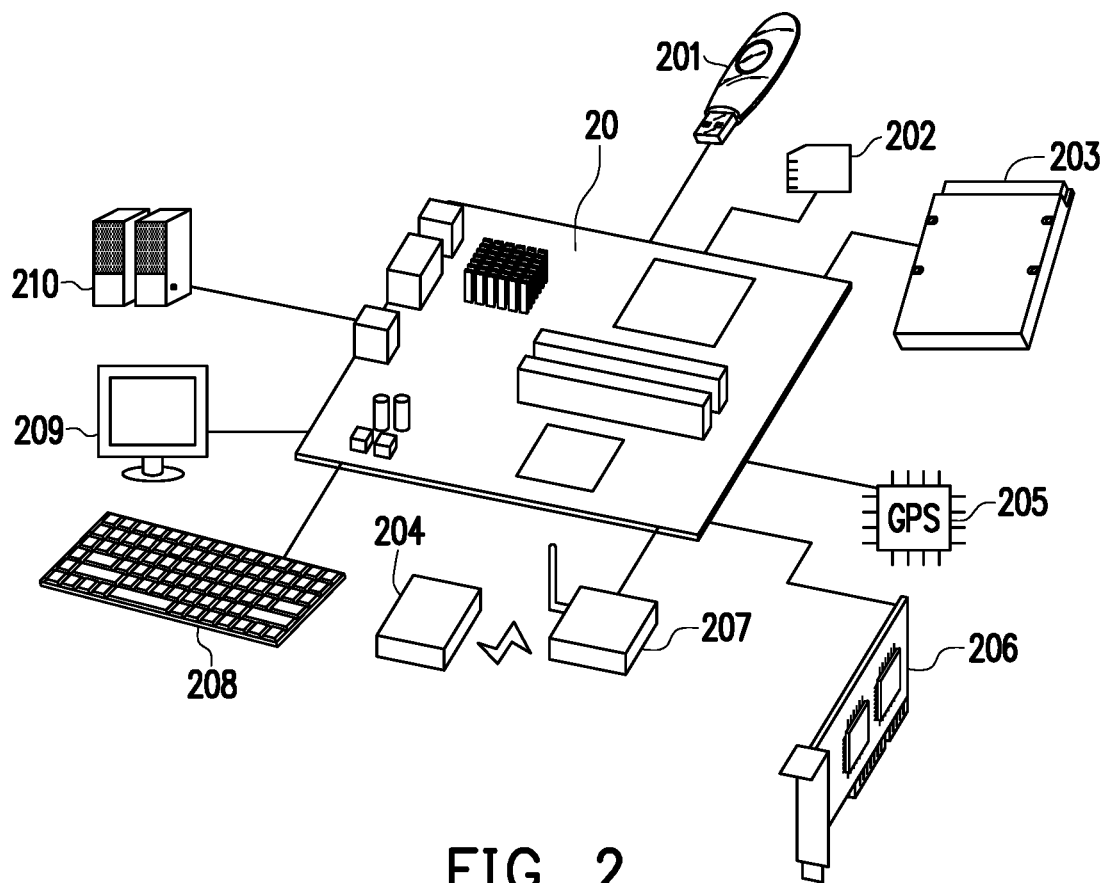
FIG. 2 is a schematic diagram illustrating a host system, a memory storage device, and an input/output (I/O) device according to another exemplary embodiment.

FIG. 1 is a schematic diagram illustrating a host system, a memory storage device, and an input/output (I/O) device according to an exemplary embodiment, and FIG. 2 is a schematic diagram illustrating a host system, a memory storage device, and an input/output (I/O) device according to another exemplary embodiment.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In the present exemplary embodiment, the host system 11 is coupled to a memory storage device 10 through the data transmission interface 114. For example, the host system 11 can write data into the memory storage device 10 or read data from the memory storage device 10 via the data transmission interface 114. Further, the host system 11 is coupled to an I/O device 12 via the system bus 110. For example, the host system 11 can transmit output signals to the I/O device 12 or receive input signals from the I/O device 12 via the system bus 110.

In the present exemplary embodiment, the processor 111, the RAM 112, the ROM 113 and the data transmission interface 114 may be disposed on a main board 20 of the host system 11. The number of the data transmission interfaces 114 may be one or more. Through the data transmission interface 114, the main board 20 may be coupled to the memory storage device 10 in a wired manner or a wireless manner. The memory storage device 10 may be, for example, a flash drive 201, a memory card 202, a SSD (Solid State Drive) 203 or a wireless memory storage apparatus 204. The wireless memory storage apparatus 204 may be, for example, a memory storage apparatus based on various wireless communication technologies, such as a NFC (Near Field Communication Storage) memory storage apparatus, a WiFi (Wireless Fidelity) memory storage apparatus, a Bluetooth memory storage apparatus, a BLE (Bluetooth low energy) memory storage apparatus (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage apparatus 204 through the wireless transmission device 207.

Figure 3:
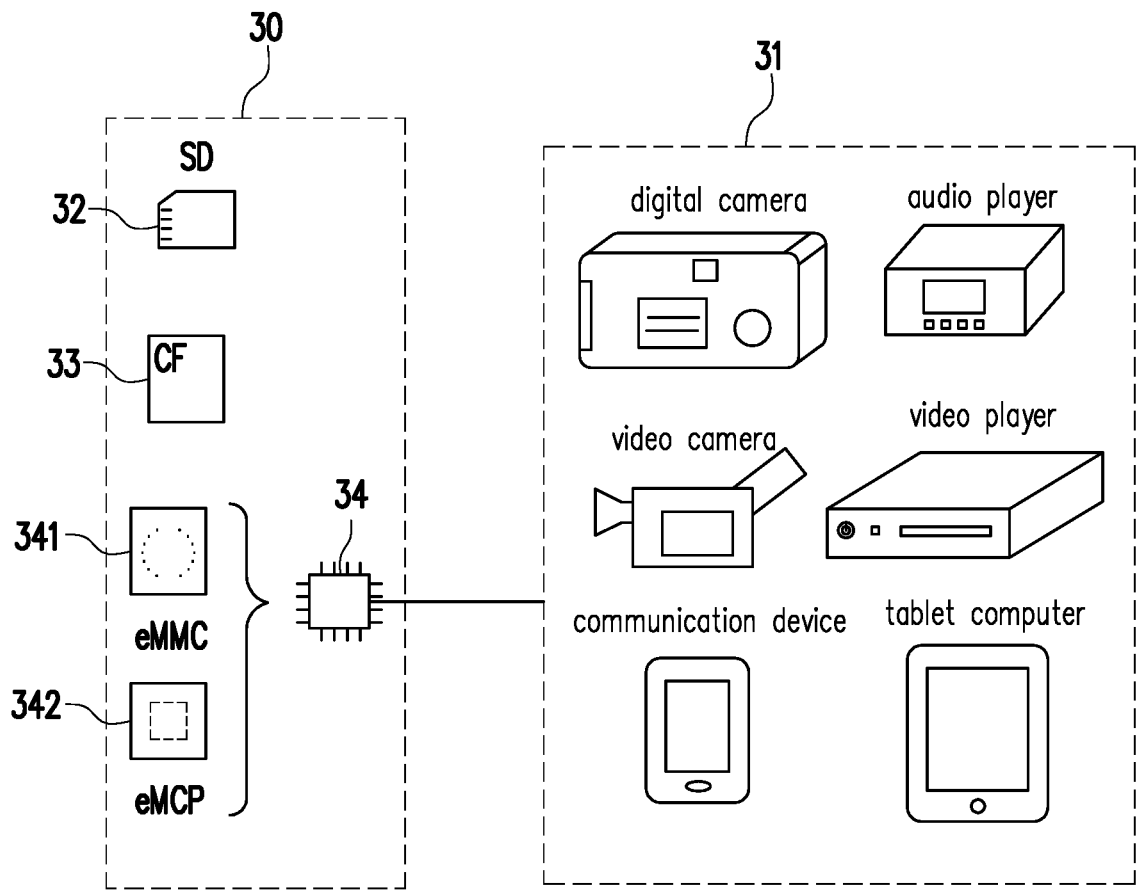
FIG. 3 is a schematic diagram illustrating a host system and a memory storage device according to another exemplary embodiment.

In an exemplary embodiment, aforementioned host system may be any system capable of substantially cooperating with the memory storage apparatus for storing data. Although the host system is illustrated as a computer system in the foregoing exemplary embodiment, nonetheless, FIG. 3 is a schematic diagram illustrating a host system and a memory storage apparatus according to another exemplary embodiment. Referring to FIG. 3, in another exemplary embodiment, a host system 31 may also be a system including a digital camera, a video camera, a communication device, an audio player, a video player or a tablet computer, whereas a memory storage apparatus 30 may be various non-volatile memory storage apparatuses used by the host system, such as a SD card 32, a CF card 33 or an embedded storage apparatus 34. The embedded storage apparatus 34 includes various embedded storage apparatuses capable of directly coupling a memory module onto a substrate of the host system, such as an eMMC (embedded MMC) 341 and/or an eMCP (embedded Multi Chip Package) 342.

Figure 4:
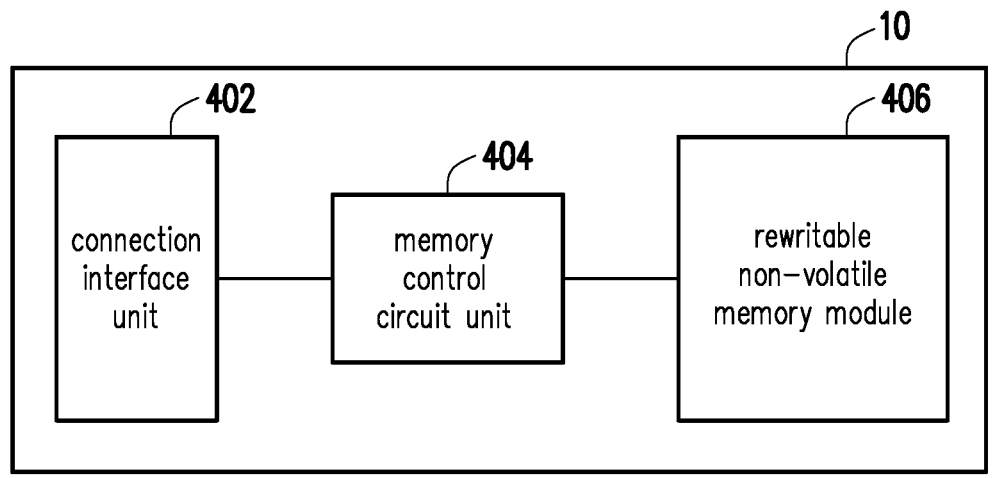
FIG. 4 is a schematic block diagram illustrating a memory storage device according to an exemplary embodiment.

FIG. 4 is a schematic block diagram illustrating a memory storage device according to an exemplary embodiment.

Referring to FIG. 4, the memory storage device 10 includes a connection interface unit 402, a memory control circuit unit 404 and a rewritable non-volatile memory module 406.

The connection interface unit 402 is configured to couple the memory storage device 10 to the host system 11. The memory storage device 10 may communicate with the host system 11 through the connection interface unit 402.

In the present exemplary embodiment, the connection interface unit 402 is compatible with a SATA (Serial Advanced Technology Attachment) standard. Nevertheless, it should be understood that the invention is not limited to the above. The connection interface unit 402 may also be compatible to a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a Secure Digital (SD) interface standard, a UHS-I (Ultra High Speed-I) interface standard, a UHS-II (Ultra High Speed-II) interface standard, a MS (Memory Stick) interface standard, a Multi-Chip Package interface standard, a MMC (Multi Media Card) interface standard, an eMMC (Embedded Multimedia Card) interface standard, a UFS (Universal Flash Storage) interface standard, an eMCP (embedded Multi Chip Package) interface standard, a CF (Compact Flash) interface standard, an IDE (Integrated Device Electronics) interface standard or other suitable standards. In the present exemplary embodiment, the connection interface unit 402 and the memory control circuit unit 404 may be packaged into one chip, or the connection interface unit 402 is distributed outside of a chip containing the memory control circuit unit.

The memory control circuit unit 404 is configured to execute a plurality of logic gates or control commands which are implemented in a hardware form or in a firmware form and perform operations of writing, reading or erasing data in the rewritable non-volatile memory storage module 406 according to the commands of the host system 11.

The rewritable non-volatile memory module 406 is coupled to the memory control circuit unit 404 and configured to store data written from the host system 11. The rewritable non-volatile memory module 406 may be a SLC (Single Level Cell) NAND flash memory module (i.e., a flash memory module capable of storing one bit in one memory cell), a MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), other flash memory modules or any memory module having the same features.

Each memory cell in the rewritable non-volatile memory module 406 stores one or more bits by the changing of a voltage (which is referred to as a threshold voltage hereinafter). Specifically, there is a charge trapping layer between a control gate and a channel of each memory cell. Through applying a writing voltage to the control gate, an amount of electrons in the charge trapping layer may be changed, so as to change the threshold voltage of each memory cell. This process of changing the threshold voltage may also be referred to as "writing data into the memory cell" or "programming the memory cell". Along with the change of the threshold voltage, each memory cell in the rewritable non-volatile memory module 406 has a plurality of storage states. Which storage state a memory cell belongs to may be determined through applying a reading voltage, so as to obtain the one or more bits stored by the memory cell.

In the present exemplary embodiment, the memory cells of the rewritable non-volatile memory module 406 constitute a plurality of physical programming units, and the physical programming units constitute a plurality of physical erasing units. Specifically, the memory cells on the same word line constitute one or more physical programming units. If each memory cell is capable of storing 2 or more bits, the physical programming units on the same word line may be categorized into a lower physical programming unit and an upper physical programming unit. For example, a least significant bit (LSB) of one memory cell belongs to the lower physical programming unit, and a most significant bit (MSB) of one memory cell belongs to the upper physical programming unit. In general, in the MLC NAND flash memory, a writing speed of the lower physical programming unit is faster than a writing speed of the upper physical programming unit, or a reliability of the lower physical programming unit is higher than a reliability of the upper physical programming unit.

In the present exemplary embodiment, a physical programming unit is the smallest unit for programming. Namely, the physical programming unit is the smallest unit for writing data. For example, the physical programming unit is a physical page or a physical sector. If the physical programming unit is the physical page, these physical programming units usually include a data bit area and a redundant bit area. The data bit area includes multiple physical sectors configured to store user data, and the redundant bit area is configured to store system data (e.g., management data such as an error correcting code). In the present exemplary embodiment, the data bit area contains 32 physical sectors, and a size of each physical sector is 512 bytes (B). Nevertheless, in other exemplary embodiments, the data bit area may also contain 8, 16 physical sectors or a greater or smaller number of physical sectors, and the size of each physical sector may also be greater or smaller. On the other hand, a physical erasing unit is the smallest unit for erasing. Namely, each physical erasing unit has the smallest number of memory cells to be erased altogether. For example, the physical erasing unit is a physical block.

Figure 5:
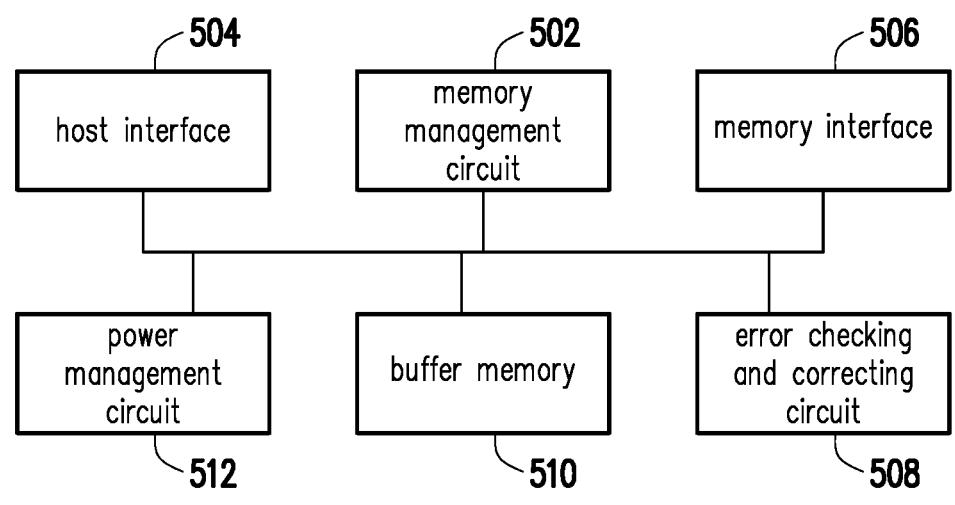
FIG. 5 is a schematic block diagram illustrating a memory control circuit unit according to an exemplary embodiment.

FIG. 5 is a schematic block diagram illustrating a memory control circuit unit according to an exemplary embodiment. Referring to FIG. 5, the memory control circuit unit 404 includes a memory management circuit 502, a host interface 504, and a memory interface 506.

The memory management circuit 502 is configured to control the overall operation of the memory controlling circuit unit 404. Specifically, the memory management circuit 502 has a plurality of control commands, and when the memory storage device 10 is in operation, the control commands are executed to perform operations of data writing, data reading, and data erasing. The operations of the memory management circuit 502 when being described below are similar to the operations of the memory controlling circuit unit 404.

In the present exemplary embodiment, the control commands of the memory management circuit 502 are implemented in a firmware form. For example, the memory management circuit 502 has a microprocessor unit (not shown) and a ROM (not shown), and the control instructions are burnt in the ROM. When the memory storage device 10 is in operation, these control commands are executed by the microprocessor unit to perform operations of data writing, data reading and data erasing.

In another exemplary embodiment, the control commands of the memory management circuit 502 may also be stored as program codes in a specific area (for example, a system area in a memory module exclusively used for storing system data) of the rewritable non-volatile memory module 406. In addition, the memory management circuit 502 includes a microprocessor unit (not illustrated), a read only memory (not illustrated), and a random access memory (not illustrated). More particularly, the read only memory has a boot code, which is executed by the microprocessor unit to load the control commands stored in the rewritable non-volatile memory module 406 to the random access memory of the memory management circuit 502 when the memory control circuit unit 404 is enabled. Afterwards, the control commands are run by the microprocessor unit to perform operations of data writing, reading, erasing, etc.

Furthermore, in another exemplary embodiment, the control commands of the memory management circuit 502 may also be implemented in a hardware form. For example, the memory management circuit 502 includes a microcontroller, a memory cell management circuit, a memory writing circuit, a memory reading circuit, a memory erasing circuit, and a data processing circuit. The memory cell management circuit, the memory writing circuit, the memory reading circuit, the memory erasing circuit, and the data processing circuit are coupled to the microcontroller. The memory cell management circuit is configured to manage the memory cells of the rewritable non-volatile memory module 406 or a group thereof. The memory writing circuit is configured to issue a write command sequence to the rewritable non-volatile memory module 406 to write data to the rewritable non-volatile memory module 406. The memory reading circuit is configured to issue a read command sequence to the rewritable non-volatile memory module 406 to read data from the rewritable non-volatile memory module 406. The memory erasing circuit is configured to issue an erase command sequence to the rewritable non-volatile memory module 406 to erase data from the rewritable non-volatile memory module 406. The data processing circuit is configured to process data to be written to the rewritable non-volatile memory module 406 and data read from the rewritable non-volatile memory module 406. The write command sequence, the read command sequence, and the erase command sequence may each include one or more program codes or command codes and are configured to instruct the rewritable non-volatile memory module 406 to perform the corresponding operations, such as data writing, reading, and erasing. In an exemplary embodiment, the memory management circuit 502 may further issue command sequences of other types to the rewritable non-volatile memory module 406 to instruct performing corresponding operations.

The host interface 504 is coupled to the memory management circuit 502 and configured to receive and identify commands and data sent from the host system 11. In other words, the commands and data transmitted by the host system 11 are transmitted to the memory management circuit 502 via the host interface 504. In this exemplary embodiment, the host interface 504 is compatible with the SATA standard. Nevertheless, it should be understood that the invention is not limited in this regard. The host interface 504 may also compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 506 is coupled to the memory management circuit 502 and configured to access the rewritable non-volatile memory module 406. In other words, data to be written into the rewritable non-volatile memory module 406 is converted into a format acceptable by the rewritable non-volatile memory module 406 via the memory interface 506. Specifically, if the memory management circuit 502 intends to access the rewritable non-volatile memory module 406, the memory interface 506 sends corresponding command sequences. For example, the command sequences may include the write command sequence as an instruction for writing data, the read command sequence as an instruction for reading data, the erase command sequence as an instruction for erasing data, and other corresponding command sequences as instructions for performing various memory operations (e.g., changing read voltage levels or performing a garbage collection procedure). These command sequences are generated by the memory management circuit 502 and transmitted to the rewritable non-volatile memory module 406 through the memory interface 506, for example. The command sequences may include one or more signals, or data transmitted in the bus. The signals or the data may include command codes and program codes. For example, information such as identification codes and memory addresses are included in the read command sequence.

In an exemplary embodiment, the memory control circuit unit 404 further includes an error checking and correcting circuit 508, a buffer memory 510, and a power management circuit 512.

The error checking and correcting circuit 508 is coupled to the memory management circuit 502 and configured to perform an error checking and correcting operation to ensure the correctness of data. Specifically, when the memory management circuit 502 receives the write command from the host system 11, the error checking and correcting circuit 508 generates an ECC (error correcting code) and/or an EDC (error detecting code) for data corresponding to the write command, and the memory management circuit 502 writes data and the ECC and/or the EDC corresponding to the write command into the rewritable non-volatile memory module 406. Then, when the memory management circuit 502 reads the data from the rewritable non-volatile memory module 406, the corresponding ECC and/or the EDC are also read, and the error checking and correcting circuit 508 performs the error checking and correcting operation on the read data based on the ECC and/or the EDC.

The buffer memory 510 is coupled to the memory management circuit 502 and configured to temporarily store data and commands from the host system 11 or data from the rewritable non-volatile memory module 406. The power management unit 512 is coupled to the memory management circuit 502 and configured to control a power of the memory storage device 10.

In an exemplary embodiment, the rewritable non-volatile memory module 406 of FIG. 4 is also referred to as a flash memory module, and the memory control circuit unit 404 also known as a flash memory controller for controlling a flash memory module. In an exemplary embodiment, the memory management circuit 502 of FIG. 5 is also referred to as a flash memory management circuit. It is noted that in the following description, some terms may be replaced with corresponding abbreviations for ease of reading (see Table 1).

TABLE 1

| | |
|---|---|
| rewritable non-volatile memory module | RNVM module |
| physical erasing unit | PEU |
| physical programming unit | PPU |
| logical erasing unit | LEU |
| logical programming unit | LPU |
| memory management circuit | MMC |
| memory control circuit unit | MCCU |

Figure 6:
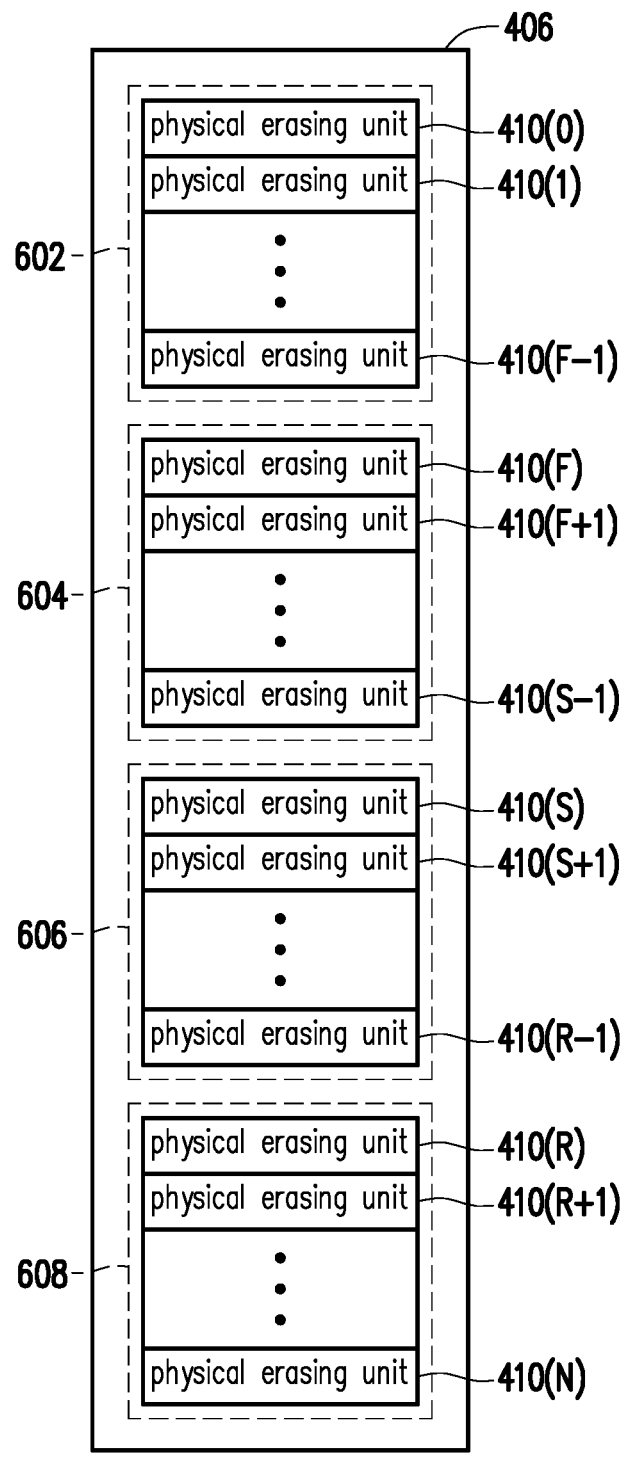
FIG. 6 and FIG. 7 are exemplary schematic diagrams of managing physical blocks according to an exemplary embodiment.
Figure 7:
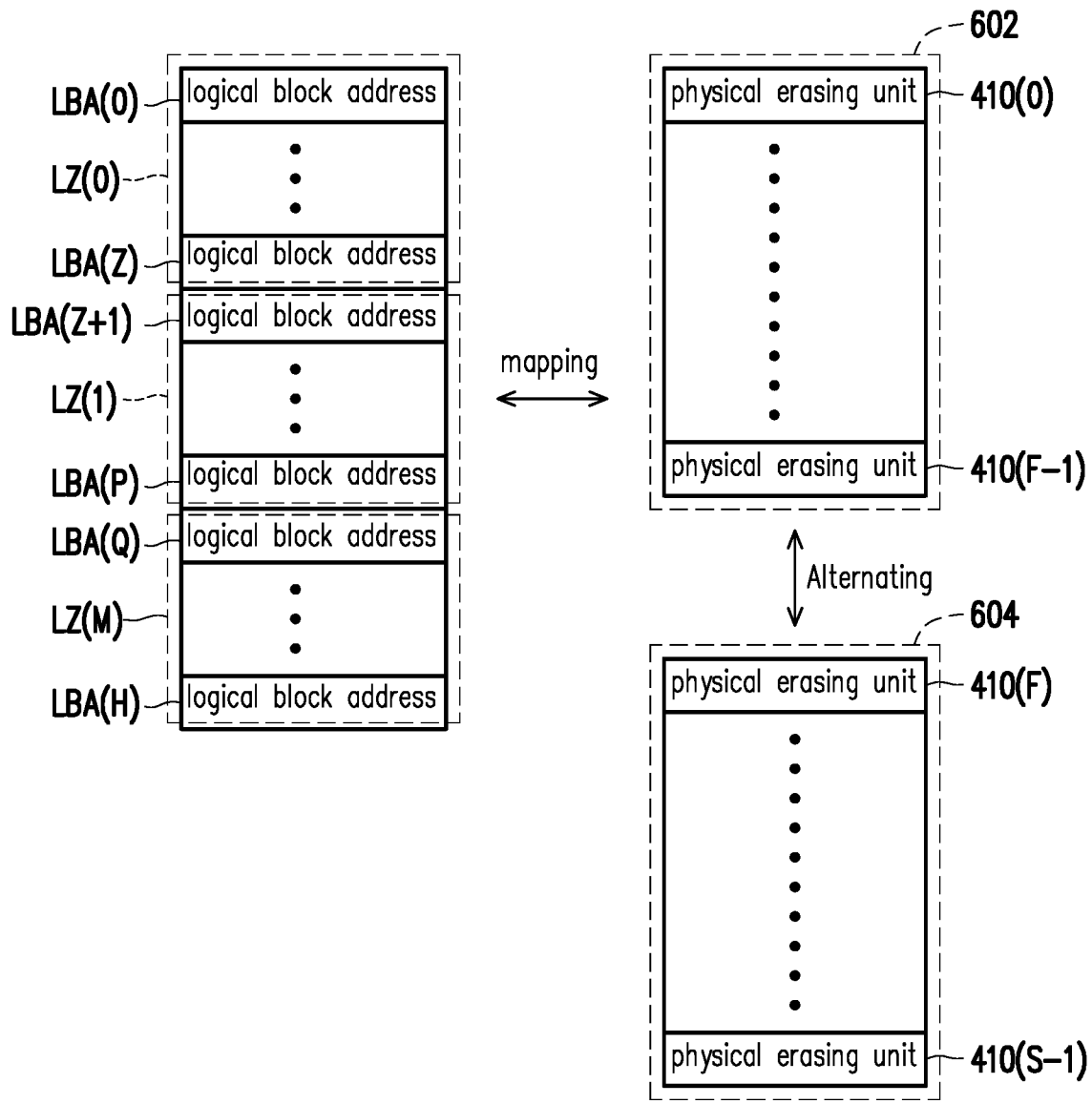

FIG. 6 and FIG. 7 are exemplary schematic diagrams of managing physical blocks according to an exemplary embodiment of the present invention. Referring to FIG. 6, the MCCU 404 (or the MMC 502) logically groups the physical erasing units 410 (0) to 410 (N) into a data area 602, a free area 604, a system area 606, and a replacement area 608.

The PEU that logically belongs to the data area 602 and the free area 604 stores the data from the host system 11. Specifically, the PEU of the data area 602 is regarded as the PEU in which the data is stored, and the PEU of the free area 604 is used to replace the PEU of the data area 602. In other words, when the host system 11 receives the write command and the data to be written, the MCCU 404 (or the MMC 502) retrieves the PEU from the free area 604, and writes the data into the retrieved PEU to replace the PEU in the data area 602.

The PEU that logically belongs to the system area 606 records system data. For example, the system data includes the manufacturer and model number of the rewritable non-volatile memory module, the number of the PEU in the rewritable non-volatile memory module, the number of PPU of each of the PEUs and so on.

The PEU that logically belongs to the replacement area 608 is used in a bad PEU replacing process to replace the damaged PEU. Specifically, if there is still normal PEU in the replacement area 608 and the PEU in the data area 602 is damaged, the MCCU 404 (or the MMC 502) retrieves the normal PEU from the replacement area 608 to replace the damaged PEU.

In particular, the number of the PEU in the data area 602, the free area 604, the system area 606 and the replacement area 608 varies according to the specification of different memories. In addition, it should be indicated that, in the operation of the memory storage device 10, the grouping relationship in which the PEU is associated to the data area 602, the free area 604, the system area 606 and the replacement area 608 is changed dynamically. For example, when the PEU in the free area 604 is damaged and replaced by the PEU in the replacement area 608, the PEU which is originally in the replacement area 608 is associated to the free area 604.

Referring to FIG. 7, the MCCU 404 (or the MMC 502) is provided with logical units LBA (0)~LBA(H) to map the PEU in the data area 602, wherein each of the logical units has a plurality of logical sub-units to map the PPU corresponding to the PEU. Meanwhile, when the host system 11 is to write data to the logical unit or updates the data stored in the logical unit, the MCCU 404 (or the MMC 502) gets a PEU from the free area 604 as an active PEU to write data, so as to alternate the PEU in the data area 602. And, when the PEU as the active PEU is filled, the MMC 502 may get an empty PEU from the free area 604 as the active PEU to write the update data corresponding to the write command from the host system 1000. In addition, when the number of available PEUs in the free area 604 is less than a default value, the MMC 502 performs a garbage collection operation (also known as a valid data merge operation) to organize valid data in the data area 602, thereby re-associating the PEU that does not store valid data in the data area 602 to the free area 604.

It should be noted that the operations, which are described as follows, the memory control circuit unit 404 can be regarded as explaining the operations of the MMC 502.

In order to solve the problem that the continuous data is stored dispersedly on different physical pages and the data reading speed is slowed down, the data arrangement method of the exemplary embodiment may determine whether to re-arrange the data by analyzing whether the data is centralized or dispersive. In another exemplary embodiment, it may determine whether to re-arrange the data by analyzing whether the data is evenly distributed in each channel. Furthermore, in another exemplary embodiment, it may determine whether to re-arrange the data by both analyzing whether the data is centralized or dispersive and whether the data is evenly distributed in each channel.

The MCCU 404 receives commands from the host system 11. The command transmitted by the host system 11 is a defragment command, and the command includes a data range. This data range is a range needed to be performed with the data arrangement operation and is determined by the host system 11.

In the present exemplary embodiment, after receiving a command from the host system 11, the MCCU 404 may use a logical estimated value of a plurality of logical block addresses in the data range and a physical estimated value of a plurality of PEUs mapped to the logical block addresses to calculate a data disarranged degree. And, the MCCU 404 may determine whether to perform a data arrangement operation according to the data disarranged degree and a threshold to move the data in the PEUs according to the logical block addresses. The MCCU 404 performs a data arrangement operation to copy data in the physical erasing units respectively mapped to continuous logical sub-units belong to the logical block addresses to the same PEU according to the logical block addresses. Here, the continuous logical sub-units represent that the logical block address of one logical sub-unit follows the logical block address of the other logical sub-unit. In other words, the starting logical block address of one logical sub-unit follows the ending logical block address of the other logical sub-unit. It should be noted that, people skilled in the art should know how to perform the data arrangement operation, so the description will not be repeated here.

In the first exemplary embodiment, the data disarranged degree is determined by analyzing whether the data is centralized or dispersive. That is, the data is determined to be centralized or dispersive according to the number of physical pages actually store the data, and whether to perform the arrangement of the data is determined based on the result of the determination.

In detail, it is assumed that the capacity of one physical page is 16K, and the data range included in the command received by the MCCU 404 from the host system 11 is a continuous logical row addresses LCA (0)~LCA (7) and there are eight 4K of data (i.e., 32K of data). Ideally, 32K of data only need 2 physical pages for storing. In other words, under the condition of the minimum physical configuration, the 32K of data is arranged on 2 (=32/16) physical pages, and the MCCU 404 only needs to read the rewritable nonvolatile memory module 406 twice for reading all of 32K of data. However, under the condition of the maximum physical configuration, the 32K of data is arranged on 8 (=32/4) physical pages, and the MCCU 404 needs to read the rewritable non-volatile memory module 406 eight times for reading all of 32K of data, which will cause slow reading speed. Accordingly, the method provided in the present exemplary embodiment calculates the logical estimated value and the physical estimated value, and determines the data disarranged degree according to the ratio of the logical estimated value (i.e., the amount for the minimum physical configuration) and the physical estimated value (i.e., the amount for the actual physical configuration), thereby determining whether the data is centralized or dispersive. And, the calculated data disarranged degree is compared to a threshold (also referred as a first threshold) to determine whether to perform the data arrangement operation. Here, the first threshold is preset to, for example, 0.75 or other values, which is not limited in the present invention.

Specifically, after receiving a command from the host system 11, the MCCU 404 may calculate the logical estimated value based on the number of logical blocks of the logical block addresses in the data range included in the command, the logical block capacity, and the physical page capacity of the rewritable non-volatile memory 406. In detail, the MCCU 404 calculates the data capacity of the data range according to the number of logical blocks and the logical block capacity, and calculate the logical estimated value according to the data capacity and the physical page capacity of the rewritable non-volatile memory module 406.

In addition, the MCCU 404 determines the physical estimated value according to the number of physical pages in the physical erasing units mapped to the logical block addressed, wherein each logical block address has a plurality of logical addresses to map to the physical block addresses (PBA) of the physical erasing units.

Then, the MCCU 404 calculates the ratio of the logical estimated value to the physical estimated value to identify the data disarranged degree, and determines whether to perform a data arrangement operation based on the data disarranged degree and a first threshold, thereby moving data in the physical erasing units according to the logical block addresses. In detail, the MCCU 404 may determine whether the data disarranged degree is not greater than the first threshold, and perform the data arrangement operation according to the logical block addresses if the data disarranged degree is not greater than the first threshold.

For example, the MCCU 404 obtains the number of logical blocks corresponding to a plurality of logical block addresses in the data range included in the command, the capacity of each logical block, and the physical page capacity of the rewritable non-volatile memory module 406, and the logical estimated value is calculated according to the following equations (1) and (2). And, the memory control circuit unit 404 obtains the number of physical pages of a plurality of physical erasing units mapped to the logical block addresses, and sets the number of physical pages as the physical estimated value.

$$\text{(the number of logical blocks)} \times \text{(logical block capacity)} = \text{data capacity} \quad (1)$$

$$\text{(data capacity)} \div \text{(physical page capacity)} = \text{logical estimated value} \quad (2)$$

Taking that the data range received by the MCCU 404 includes a continuous logical row addresses LCA (0)~LCA (7) as an example, the number of logical blocks is 8, the logical page capacity is assumed to be 4K, the physical page capacity is assumed to be 16K, and the number of physical pages in the physical erasing units mapped to the logical row addresses LCA (0)~LCA (7) is 3. Accordingly, the calculated logical estimate value is 2(=8×4±16), and the physical estimated value is 3. It should be noted that the present invention does not limit the logical page capacity and the physical page capacity. The logical page capacity and the physical page capacity may be different according to different standards of the memory storage device. In the present exemplary embodiment, the MCCU 404 can calculate a ratio of the logical estimated value to the physical estimated value is ⅔ (i.e., 0.66). Because the calculated ratio is 0.66 (i.e., data disarranged degree), which is less than the first threshold (for example, 0.75), it represents that the data in this data range is not centralized enough, so the data arrangement operation must be performed.

In another exemplary embodiment, the number of physical pages corresponding to the physical erasing units mapped to the logical row addresses LCA (0)~LCA (7) is 2, so the physical estimated value is 2. Accordingly, the MCCU 404 may calculate the ratio of the logical estimated value to the physical estimated value is 2/2 (i.e., 1). Since the calculated ratio is 1, which is greater than the first threshold (for example, 0.75), it represents the data in the data range is centralized, so the data arrangement operation is not needed.

In a second exemplary embodiment, the data disarranged degree may be determined by analyzing whether the data is evenly distributed in each channel. That is, whether to perform the data arrangement operation is determined by determining whether the number of logical pages corresponding to the data is evenly distributed on the plane.

It is assumed that the capacity of one physical page is 16K, the data range included in the command received by the MCCU 404 from the host system 11 includes a continuous logical row addressed LCA (0)~LCA (7), and there are eight 4K of Data (i.e., 32K of data). Ideally, 32K of data only need 2 physical pages for storing. In a better case, these two physical pages are distributed on different physical planes, which represents that the data on each physical plane is even. In this situation, the MCCU 404 may read data in each physical plane, and the performance of reading data is better. Conversely, if these two physical pages are distributed on the same physical plane, it represents that the data is centralized on one physical plane and the performance of reading data is better. Accordingly, the method provided in this exemplary embodiment may calculate the number of logical pages and the number of physical planes to determine the data disarranged degree, thereby determining whether the data included in each physical plane is centralized or dispersive. And, by comparing the number of pages configured in one of the physical planes corresponded to the physical erasing units mapped to the logical block addressed included in the data range with a second threshold, whether to perform the data arrangement operation can be determined. Here, the number of pages here refers to the number of physical pages, and the second threshold is determined by a third threshold and the data disarranged degree. For example, the third threshold is preset to 2 or another value, which is not limited in the present invention.

Specifically, after receiving the command from the host system 11, the MCCU 404 determines the logical estimated value according to the number of logical pages corresponding to the logical block addresses in the data range included in the command. And, the MCCU 404 determines the physical estimated value according to the number of physical planes corresponding to the physical erasing units mapped to the logical block addresses. Then, the MCCU 404 calculates the data disarranged degree according to the logical estimated value and the physical estimated value, and calculates the second threshold according to the data disarranged degree and the third threshold. When the number of pages configured in one of the physical planes corresponding to the physical erasing units mapped to the logical block addresses is not less than the second threshold, the memory control circuit unit 404 performs the data arrangement operation according to the logical block addresses.

In detail, the MCCU 404 obtains the number of logical pages, which corresponds to the logical block addresses in the data range included in the command, as the logical estimated value. And, the MCCU 404 obtains the number of physical planes, which corresponds to the physical erasing units mapped to the logical block addresses as the physical estimated values. Then, the MCCU 404 calculates the data disarranged degree according to the following equations (3) and (4).

$$\text{(logical estimated value)} \div \text{(physical estimated value)} = A \quad (3)$$

$$\text{(logical estimation)} \% \text{(physical estimated value)} = B \quad (4)$$

The calculated value of A is set as data disarranged degree, which indicates the minimum number of pages configured in a physical plane under a case where the data is even. The sum of the calculated value of A and the calculated value of B indicates the optimal maximum number of pages in each physical plane. The worst case is that each logical page configured to concentrate on the same physical plane. The present exemplary embodiment pre-sets the third threshold as an allowable threshold for the number of pages configured in each physical plane, and determines the second threshold based on the third threshold and the data disarranged degree.

For example, taking that the number of logical pages corresponding to the logical block addresses included in the data range received by the memory control circuit unit 404 is 17 and the number of physical planes corresponding to each physical erasing unit mapped to the logical block addresses is 4 as an example, the logical estimated value is 17 and the physical estimated value is 4. The MCCU 404 calculates the value of A according to the equation (3) and the second threshold, wherein A is 4 and the second threshold is 6 (i.e., A plus the third threshold (for example, 2)). If the MCCU 404 determines that the number of pages configured in the physical planes corresponding to the physical erasing units mapped to the logical block addresses included in the data range is not less than 6 (i.e., the second threshold), it represents that the data is too concentrated in some of the physical planes and the MCCU 404 performs the data arrangement operation according to the logical block addresses. Conversely, if the MCCU 404 determines that the number of pages configured in the physical planes corresponding to the physical erasing units mapped to the logical block addresses included in the data range is less than 6 (i.e., the second threshold), it represents that the data is evenly distributed on each physical plane and the MCCU 404 does not perform the data arrangement operation.

In a third exemplary embodiment, the MCCU 404 may use both of the methods provided in the first exemplary embodiment and the second exemplary embodiment to determine whether to perform the data arrangement operation. The methods are described in detail above, and will not be repeated here.

Figure 8:
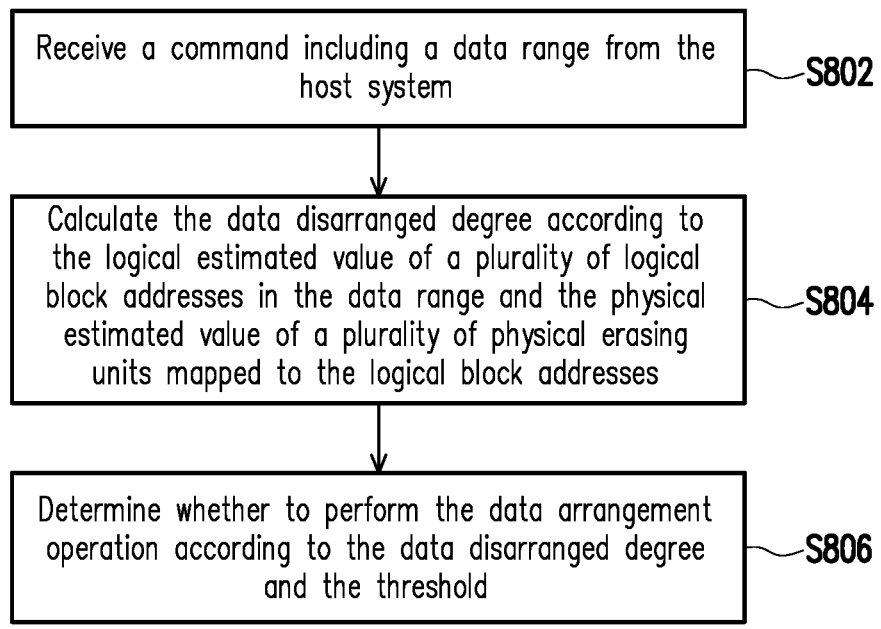
FIG. 8 is a flowchart illustrating a data arrangement method according to an exemplary embodiment.

FIG. 8 is a flowchart illustrating a data arrangement method according to an exemplary embodiment.

Referring to FIG. 8, in step S802, a command is received from the host system, wherein the command includes a data range. In step S804, the data disarranged degree is calculated according to the logical estimated value of a plurality of logical block addresses in the data range and the physical estimated value of a plurality of physical erasing units mapped to the logical block addresses. In step S806, whether to perform the data arrangement operation is determined according to the data disarranged degree and the threshold.

Figure 9:
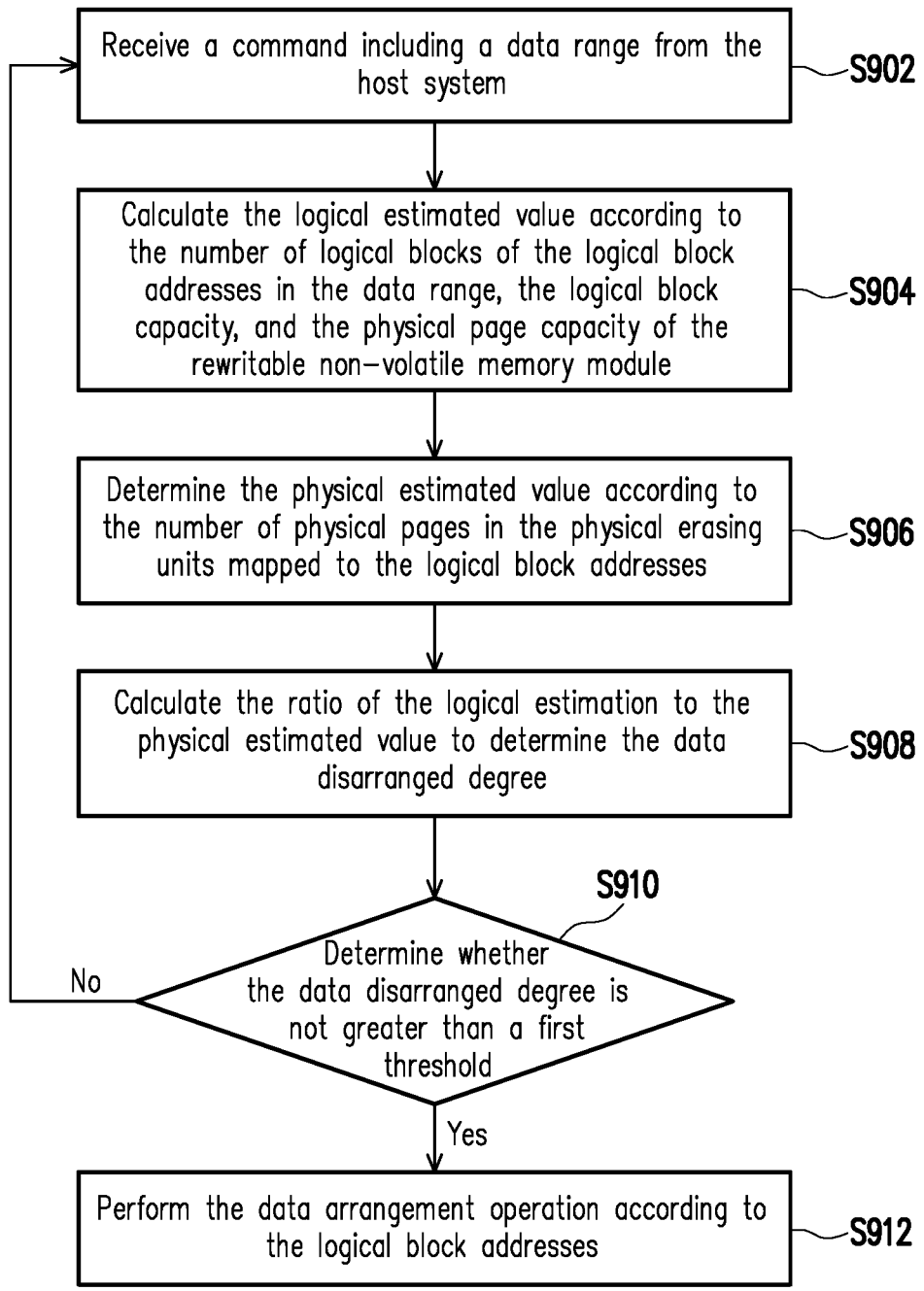
FIG. 9 is a flowchart illustrating a data arrangement method according to an exemplary embodiment.

FIG. 9 is a flowchart illustrating a data arrangement method according to an exemplary embodiment. Referring to FIG. 9, in step S902, a command is received from the host system, wherein the command includes a data range. In step S904, the logical estimated value is calculated according to the number of logical blocks of the logical block addresses in the data range, the logical block capacity, and the physical page capacity of the rewritable non-volatile memory module. In step S906, the physical estimated value is determined according to the number of physical pages in the physical erasing units mapped to the logical block addresses. In step S908, the ratio of the logical estimation to the physical estimated value is calculated to determine the data disarranged degree. In step S910, whether the data disarranged degree is not greater than a first threshold is determined. If the data disarranged degree is not greater than the first threshold, in step S912, the data arrangement operation is performed according to the logical block addresses. If the data disarranged degree is greater than the first threshold, step S902 is performed to wait for another command.

Figure 10:
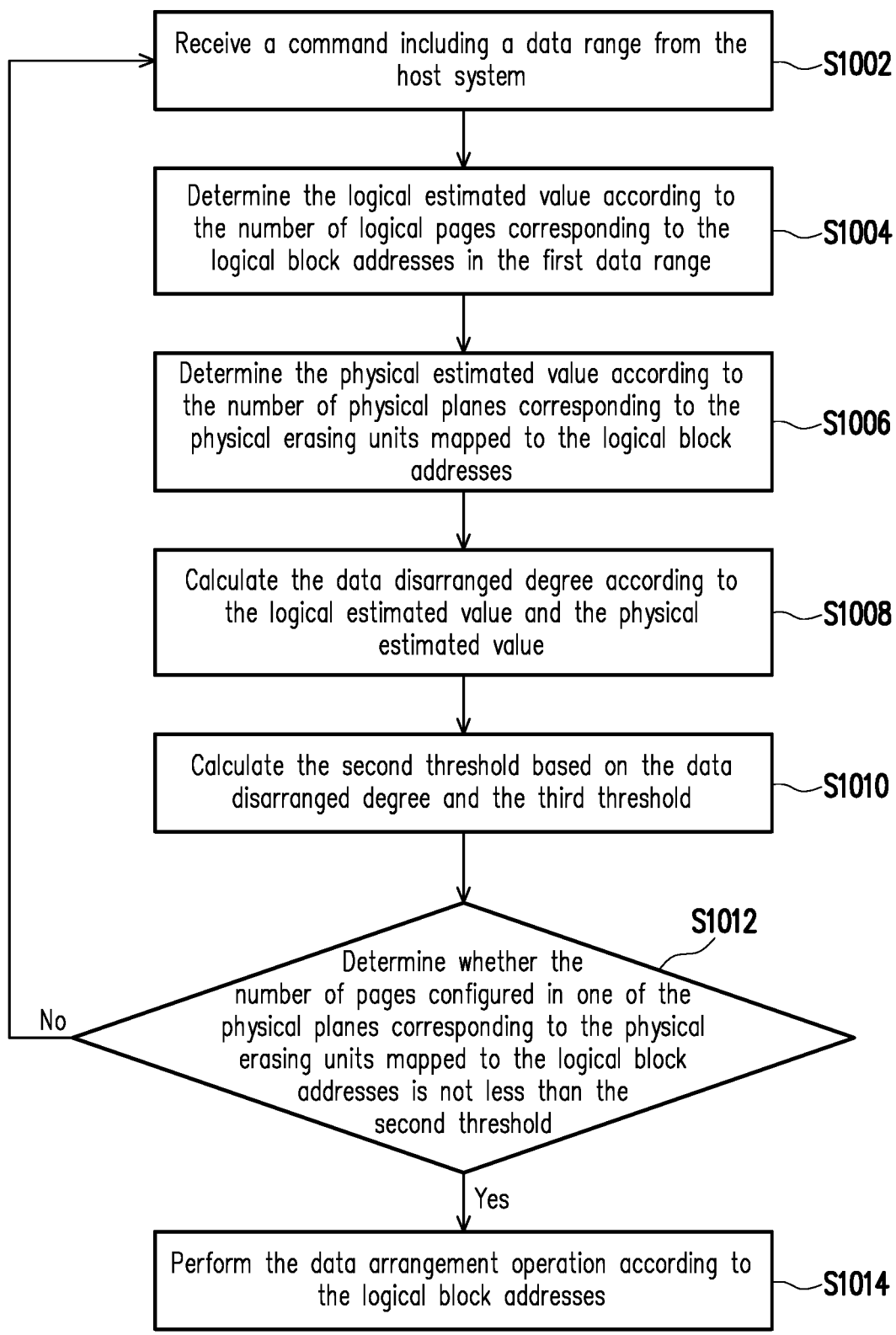
FIG. 10 is a flowchart illustrating a data arrangement method according to an exemplary embodiment.

FIG. 10 is a flowchart illustrating a data arrangement method according to an exemplary embodiment. In step S1002, a command is received from the host system, wherein the command includes a first data range. In step S1004, the logical estimated value is determined according to the number of logical pages corresponding to the logical block addresses in the first data range. In step S1006, the physical estimated value is determined according to the number of physical planes corresponding to the physical erasing units mapped to the logical block addresses. In step S1008, the data disarranged degree is calculated according to the logical estimated value and the physical estimated value. In step S1010, the second threshold is calculated based on the data disarranged degree and the third threshold. In step S1012, whether the number of pages configured in one of the physical planes corresponding to the physical erasing units mapped to the logical block addresses is not less than the second threshold is determined. If the number of pages is not less than the second threshold, in step S1014, the data arrangement operation is performed according to the logical block addresses. If the number of pages is less than the second threshold, step S1002 is performed to wait for another command.

It should be noted that the steps in FIGS. 8 to 10 may be implemented by codes or circuits, which is not limited in the present invention. In addition, the methods of FIGS. 8 to 10 may be used in conjunction with the above exemplary embodiments, or may be used alone, which is not limited in the present invention.

In summary, the data arrangement method, the memory storage device, and the memory control circuit unit provided in the exemplary embodiments may calculate the data disarranged degree according to the logical estimated value of the logical block addresses included in the data range and the physical estimated value of the physical erasing units mapped to the logical block addresses, thereby comparing the data disarranged degree with the threshold to determine whether the data is centralized or dispersive. Accordingly, whether the data arrangement operation is performed in the data range may be determined and the speed of reading data can be increased. The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data arrangement method, for a memory storage device including a rewritable non-volatile memory module, the method comprising:
receiving a command from a host system, wherein the command includes a data range;
calculating a data disarranged degree according to a logical estimated value of a plurality of logical block addresses in the data range and a physical estimated value of a plurality of physical erasing units mapped to the logical block addresses; and determining whether to perform a data arrangement operation to move data in the physical erasing units according to the logical block addresses based on the data disarranged degree and a threshold, wherein the step of calculating the data disarranged degree according to the logical estimated value of the plurality of logical block addresses in the data range and the physical estimated value of the plurality of physical erasing units mapped to the logical block addresses comprises:

determining the logical estimated value according to the number of the logical block addresses in the data range, a capacity of the logical block addresses, and a physical page capacity of the rewritable non-volatile memory module;

determining the physical estimated value according to the number of physical pages in the physical erasing units mapped to the logical block addresses; and calculating a ratio of the logical estimated value and the physical estimated value to determine the data disarranged degree.

2. The data arrangement method according to claim 1, wherein the command includes a defragment command.

3. The data arrangement method according to claim 1, wherein the step of determining the logical estimated value according to the number of the logical block addresses in the data range, the capacity of the logical block addresses, and the physical page capacity of the rewritable non-volatile memory module comprises:

calculating a data capacity of the data range according to the number of the logical block addresses and the capacity of the logical block addresses; and calculating the logical estimated value based on the data capacity and the physical page capacity of the rewritable non-volatile memory module.

4. The data arrangement method according to claim 1, wherein the step of determining whether to perform the data arrangement operation to move the data in the physical erasing units according to the logical block addresses based on the data disarranged degree and the threshold comprises:

performing the data arrangement operation according to the logical block addresses if the data disarranged degree is not greater than a first threshold.

5. A data arrangement method, for a memory storage device including a rewritable non-volatile memory module, the method comprising:

receiving a command from a host system, wherein the command includes a data range;

calculating a data disarranged degree according to a logical estimated value of a plurality of logical block addresses in the data range and a physical estimated value of a plurality of physical erasing units mapped to the logical block addresses; and determining whether to perform a data arrangement operation to move data in the physical erasing units according to the logical block addresses based on the data disarranged degree and a threshold, wherein the step of calculating the data disarranged degree according to the logical estimated value of the plurality of logical block addresses in the data range and the physical estimated value of the plurality of physical erasing units mapped to the logical block addresses comprises:

determining the logical estimated value according to the number of logical pages corresponding to the logical block addresses in the data range;

determining the physical estimated value according to the number of physical planes corresponding to the physical erasing units mapped to the logical block addresses; and calculating the data disarranged degree according to the logical estimated value and the physical estimated value.

6. The data arrangement method according to claim 5, wherein the step of determining whether to perform the data arrangement operation to move the data in the physical erasing units according to the logical block addresses based on the data disarranged degree and the threshold comprises:

calculating a second threshold based on the data disarranged degree and a third threshold; and performing the data arrangement operation according to the logical block addresses if the number of pages configured in one of the physical planes corresponding to the physical erasing units mapped to the logical block addresses is not less than the second threshold.

7. A memory storage device, comprising:

a connection interface unit, configured to couple to a host system;

a rewritable non-volatile memory module; and a memory control circuit unit, coupled to the connection interface unit and the rewritable non-volatile memory module, wherein the memory control circuit unit is configured to receive a command from a host system and the command includes a data range, the memory control circuit unit is further configured to calculate a data disarranged degree according to a logical estimated value of a plurality of logical block addresses in the data range and a physical estimated value of a plurality of physical erasing units mapped to the logical block addresses, and the memory control circuit unit is further configured to determine whether to perform a data arrangement operation to move data in the physical erasing units according to the logical block addresses based on the data disarranged degree and a threshold, wherein in the operation of calculating the data disarranged degree according to the logical estimated value of the plurality of logical block addresses in the data range and the physical estimated value of the plurality of physical erasing units mapped to the logical block addresses, the memory control circuit unit calculates the logical estimated value according to the number of the logical block addresses in the data range, a capacity of the logical block addresses, and a physical page capacity of the rewritable non-volatile memory module, the memory control circuit unit determines the physical estimated value according to the number of physical pages in the physical erasing units mapped to the logical block addresses, and the memory control circuit unit calculates a ratio of the logical estimated value and the physical estimated value to determine the data disarranged degree.

8. The memory storage device according to claim 7, wherein the command includes a defragment command.

9. The memory storage device according to claim 7, wherein in the operation of calculating the logical estimated value according to the number of the logical block addresses in the data range, a capacity of the logical block addresses, and a physical page capacity of the rewritable non-volatile memory module, the memory control circuit unit calculates a data capacity of the data range according to the number of the logical block addresses and the capacity of the logical block addresses, and the memory control circuit unit calculates the logical estimated value based on the data capacity and the physical page capacity of the rewritable non-volatile memory module.

10. The memory storage device according to claim 7, wherein in the operation of determining whether to perform the data arrangement operation to move the data in the physical erasing units according to the logical block addresses based on the data disarranged degree and the threshold, the memory control circuit unit performs the data arrangement operation according to the logical block addresses if the data disarranged degree is not greater than a first threshold.

11. A memory storage device, comprising:

a connection interface unit, configured to couple to a host system;

a rewritable non-volatile memory module; and a memory control circuit unit, coupled to the connection interface unit and the rewritable non-volatile memory module, wherein the memory control circuit unit is configured to receive a command from a host system and the command includes a data range, the memory control circuit unit is further configured to calculate a data disarranged degree according to a logical estimated value of a plurality of logical block addresses in the data range and a physical estimated value of a plurality of physical erasing units mapped to the logical block addresses, and the memory control circuit unit is further configured to determine whether to perform a data arrangement operation to move data in the physical erasing units according to the logical block addresses based on the data disarranged degree and a threshold, wherein in the operation of calculating the data disarranged degree according to the logical estimated value of the plurality of logical block addresses in the data range and the physical estimated value of the plurality of physical erasing units mapped to the logical block addresses, the memory control circuit unit determines the logical estimated value according to the number of logical pages corresponding to the logical block addresses in the data range the memory control circuit unit determines the physical estimated value according to the number of physical planes corresponding to the physical erasing units mapped to the logical block addresses, and the memory control circuit unit calculates the data disarranged degree according to the logical estimated value and the physical estimated value.

12. The memory storage device according to claim 11, wherein in the operation of determining whether to perform the data arrangement operation to move the data in the physical erasing units according to the logical block addresses based on the data disarranged degree and the threshold, the memory control circuit unit calculates a second threshold based on the data disarranged degree and a third threshold, and the memory control circuit unit performs the data arrangement operation according to the logical block addresses if the number of pages configured in one of the physical planes corresponding to the physical erasing units mapped to the logical block addresses is not less than the second threshold.

13. A memory control circuit unit for controlling a memory storage device including a rewritable non-volatile memory module, and the memory control circuit unit comprising:

a host interface configured to couple to a host system;

a memory interface, coupled to the rewritable non-volatile memory module; and a memory management circuit coupled to the host interface and the memory interface, wherein the memory management circuit is configured to receive a command from a host system and the command includes a data range, the memory management circuit is further configured to calculate a data disarranged degree according to a logical estimated value of a plurality of logical block addresses in the data range and a physical estimated value of a plurality of physical erasing units mapped to the logical block addresses, and the memory management circuit is further configured to determine whether to perform a data arrangement operation to move data in the physical erasing units according to the logical block addresses based on the data disarranged degree and a threshold, wherein in the operation of calculating the data disarranged degree according to the logical estimated value of the plurality of logical block addresses in the data range and the physical estimated value of the plurality of physical erasing units mapped to the logical block addresses, the memory management circuit calculates the logical estimated value according to the number of the logical block addresses in the data range, a capacity of the logical block addresses, and a physical page capacity of the rewritable non-volatile memory module, the memory management circuit determines the physical estimated value according to the number of physical pages in the physical erasing units mapped to the logical block addresses, and the memory management circuit calculates a ratio of the logical estimated value and the physical estimated value to determine the data disarranged degree.

14. The memory control circuit unit according to claim 13, wherein the command includes a defragment command.

15. The memory control circuit unit according to claim 13, wherein in the operation of calculating the logical estimated value according to the number of the logical block addresses in the data range, a capacity of the logical block addresses, and a physical page capacity of the rewritable non-volatile memory module, the memory management circuit calculates a data capacity of the data range according to the number of the logical block addresses and the capacity of the logical block addresses, and the memory management circuit calculates the logical estimated value based on the data capacity and the physical page capacity of the rewritable non-volatile memory module.

16. The memory control circuit unit according to claim 13, wherein in the operation of determining whether to perform the data arrangement operation to move the data in the physical erasing units according to the logical block addresses based on the data disarranged degree and the threshold, the memory management circuit performs the data arrangement operation according to the logical block addresses if the data disarranged degree is not greater than a first threshold.

17. A memory control circuit unit for controlling a memory storage device including a rewritable non-volatile memory module, and the memory control circuit unit comprising:
- a host interface configured to couple to a host system;
- a memory interface, coupled to the rewritable non-volatile memory module; and
- a memory management circuit coupled to the host interface and the memory interface,
- wherein the memory management circuit is configured to receive a command from a host system and the command includes a data range,
- the memory management circuit is further configured to calculate a data disarranged degree according to a logical estimated value of a plurality of logical block addresses in the data range and a physical estimated value of a plurality of physical erasing units mapped to the logical block addresses, and
- the memory management circuit is further configured to determine whether to perform a data arrangement operation to move data in the physical erasing units according to the logical block addresses based on the data disarranged degree and a threshold, wherein in the operation of calculating the data disarranged degree according to the logical estimated value of the plurality of logical block addresses in the data range and the physical estimated value of the plurality of physical erasing units mapped to the logical block addresses,
- the memory management circuit determines the logical estimated value according to the number of logical pages corresponding to the logical block addresses in the data range
- the memory management circuit determines the physical estimated value according to the number of physical planes corresponding to the physical erasing units mapped to the logical block addresses, and
- the memory management circuit calculates the data disarranged degree according to the logical estimated value and the physical estimated value.

18. The memory control circuit unit according to claim 17, wherein in the operation of determining whether to perform the data arrangement operation to move the data in the physical erasing units according to the logical block addresses based on the data disarranged degree and the threshold,
- the memory management circuit calculates a second threshold based on the data disarranged degree and a third threshold, and
- the memory management circuit performs the data arrangement operation according to the logical block addresses if the number of pages configured in one of the physical planes corresponding to the physical erasing units mapped to the logical block addresses is not less than the second threshold.

* * * * *